United States Patent
Wirth et al.

(10) Patent No.: US 7,135,709 B1
(45) Date of Patent: Nov. 14, 2006

(54) SURFACE STRUCTURED LIGHT-EMITTING DIODE WITH IMPROVED CURRENT COUPLING

(75) Inventors: Ralph Wirth, Regensburg (DE); Klaus Streubel, Laaber (DE)

(73) Assignee: Osram GmbH, Regensburg (DE)

( * ) Notice: Subject to any disclaimer, the term of this patent is extended or adjusted under 35 U.S.C. 154(b) by 0 days.

(21) Appl. No.: 10/089,017

(22) PCT Filed: Sep. 21, 2000

(86) PCT No.: PCT/DE00/03291

§ 371 (c)(1),
(2), (4) Date: Jul. 19, 2002

(87) PCT Pub. No.: WO01/24280

PCT Pub. Date: Apr. 5, 2001

(30) Foreign Application Priority Data

Sep. 30, 1999 (DE) .................. 199 47 030

(51) Int. Cl.
*H01L 33/00* (2006.01)

(52) U.S. Cl. ......... 257/95; 257/E33.063; 257/E33.068; 438/29

(58) Field of Classification Search .................. 257/79, 257/81, 88, 91, 95, 99, E33.062, E33.063, 257/E33.067, 98; 438/28, 29, 32, 71, 27
See application file for complete search history.

(56) References Cited

U.S. PATENT DOCUMENTS 4,864,370 A * 9/1989 Gaw et al. ................... 257/94
5,008,718 A 4/1991 Fletcher et al. .............. 357/17
5,233,204 A 8/1993 Fletcher et al. .............. 257/13
5,309,001 A * 5/1994 Watanabe et al. ............ 257/99
5,698,865 A * 12/1997 Gerner et al. ................ 257/94
5,744,828 A 4/1998 Nozaki et al. ................ 257/94
5,779,924 A 7/1998 Krames et al. ............... 216/24
6,107,644 A * 8/2000 Shakuda et al. .............. 257/79
6,277,665 B1* 8/2001 Ma et al. ...................... 438/46
6,420,735 B1* 7/2002 Kim ............................. 257/95
6,469,324 B1* 10/2002 Wang .......................... 257/98
6,504,180 B1* 1/2003 Heremans et al. ............ 257/98

FOREIGN PATENT DOCUMENTS

| DE | 4218806 A1 | 12/1993 |
| DE | 19709228 A1 | 9/1997 |
| EP | 0405757 A2 | 1/1992 |
| EP | 0544512 A1 | 11/1992 |
| JP | 61006880 A | 1/1986 |
| JP | 7-162037 | 6/1995 |
| JP | 07162037 A * | 6/1995 |

OTHER PUBLICATIONS

Cuevas, A. et al: "26-Percent Efficient Point-Junction Concentrator Solar Cells with a Front Metal Grid", IEEE Electron Device Letters 11 (1), Jan. 1990, p. 6-8.

* cited by examiner

*Primary Examiner*—Carl Whitehead, Jr.
*Assistant Examiner*—Jennifer M. Dolan
(74) *Attorney, Agent, or Firm*—Fish & Richardson P.C.

(57) ABSTRACT

Structured-surface light-emitting diode having a light generating layer and a relatively thick, transparent current-spreading layer, vertical structuring of the top surface of the current-spreading layer serves to improve the decoupling of light, while at the same time, a second electrical contact layer with a distributed, lateral structure operates to achieve substantially uniform coupling of electrical current into the current-spreading layer.

22 Claims, 4 Drawing Sheets

SURFACE STRUCTURED LIGHT-EMITTING DIODE WITH IMPROVED CURRENT COUPLING

This application is a national phase application of PCT application PCT/DE00/03291 filed Sep. 21, 2000, which claims priority to German patent application no. 199 47 030.8 filed Sep. 30, 1999.

BACKGROUND OF THE INVENTION

The invention concerns a light-emitting diode. In particular, the invention concerns a structured-surface light-emitting diode in which, to improve the uniformity of current supply, an electrical contact layer has a lateral structure by means of which substantially uniform coupling of the electrical current into the light-emitting diode can be achieved.

Light-emitting diodes, such as semiconductor light-emitting diodes (LEDs), are distinguished in particular by the fact that, depending on the system of materials, the internal conversion efficiency of input electrical energy into radiation energy can be very high, i.e., well above 80%. However, the effective decoupling of light from the semiconductor crystal is impaired by the large jump in refractive index between the semiconductor material (typically n=3.5) and the surrounding resin casting material (typically n=1.5). Owing to the resultant small total angle of reflection, of about 26°, at the interface between the semiconductor and the resin casting material, only a fraction of the light generated can be decoupled. With the simple, cubic LED shape typically used in fabrication, a bundle of rays that is not emitted within the roughly 26°-wide decoupling cone remains trapped in the semiconductor crystal, since its angle with respect to the surface normals is not changed even by multiple reflection. As a result, sooner or later the bundle of rays is lost due to absorption, primarily in the area of the contact or the active region or in the substrate. In the case of InGaAIP LEDs, in particular, the absorbing GaAs substrate is a special problem. In conventional LEDs of this kind, the rays emitted from the active region toward the surface of the LED and lying outside the decoupling cone are very likely to be lost in the substrate due to absorption.

The method most commonly used in practice to alleviate this problem is to deposit a thick layer of semiconductor on the top face of the LED. This makes it possible to obtain partial use of the lateral decoupling cones of the emitted luminous radiation.

In U.S. Pat. No. 5,008,718 it is proposed, in an AlGaInP LED, to deposit an electrically conductive GaP layer that is transparent to the emitted luminous radiation on the active, light-emitting layers, primarily to bring about lateral spreading of the current injected through an electrical contact. The advantageous side effect of decreasing total internal reflection and the fact that lateral decoupling of the light beam is made possible by the action of the thick GaP layer have been pointed out elsewhere. In addition, it is proposed to remove the GaAs substrate, which is opaque to the emitted light beam, by etching and to replace at least one transparent layer of the substrate with a suitable material, such as GaP.

The use of one or more thick and transparent layers in a light-emitting diode is also proposed in U.S. Pat. No. 5,233,204. Various configurations for the arrangement and number of these transparent layers are described. These include disposing below the active, light-generating layer a layer realized in a funnel shape and tapering in the direction of the substrate (FIG. 10).

The earliest computer simulations revealed that surface structuring of the topmost thick, transparent semiconductor layer resulted in improved light decoupling values. In particular, surface structuring comprising preferably regularly arranged n-sided prisms, pyramids or frusta of pyramids, cylinders, cones, frusta of cones and the like led to a marked improvement in the decoupling of light. This is because the rays, which initially travel steeply upward, are reflected at the structured surfaces but travel at a lower angle upon each reflection, so that they ultimately are decoupled laterally from the side walls of the structured regions of the top surface.

Such structured-surface light-emitting diodes were initially fabricated by growing the light-generating semiconductor layers on a semiconductor substrate, followed by the upper thick, transparent semiconductor layer, and then depositing a central electrical contact surface on the top surface of the thick semiconductor layer. The top surface of the thick semiconductor layer was then structured by means of etching technology in the areas outside the central contact surface, after which the back of the substrate was thinned and provided with a back contact. This approach proved to be disadvantageous, however, since the thick semiconductor layer, the so-called window, is fragmented by the structuring, causing the current spreading to deteriorate. Thus, there is no adequate distribution of electrical-current in the-regions outside the central contact surface, and the improvement in light decoupling brought about by the structuring is therefore offset by the deficient current spread and the increase in overall luminous flux does not turn out as desired.

It is, accordingly, an object of the present invention to provide a light-emitting diode with high effective decoupling of light. In particular, it is an object of the present invention to simultaneously ensure, in a light-emitting diode, good spatial distribution of the initiated electrical current and good decoupling of the optical light beam.

SUMMARY OF INVENTION

As described therein, the present invention describes a light-emitting diode with a semiconductor layer structure including a substrate and at least one light-generating layer formed on the substrate and one transparent current-spreading layer deposited on the light-generating layer, a first electrical contact layer on the back of the substrate, and a second electrical contact layer disposed on the current-spreading layer, the top surface of the current-spreading layer having vertical structuring to improve the decoupling of light, and the second electrical contact layer having a lateral structure by means of which substantially uniform coupling of the electrical current into the current-spreading layer can be achieved. The current-spreading layer is preferably relatively thick, particularly within a range of between 5 and 80 im.

The invention is therefore based on a combination of surface structuring of the semiconductor, which contributes to the decoupling of light, and an improved current-spreading layer, said function being performed by a second electrical contact layer shaped into, in the broadest sense, a metal contact grid. The term "grid" is to be understood here and in the following not only as a strictly periodic, closed grid, but also as individual contact fingers or another guide composed of metal webs and suitable for establishing contact. Such a grid overcomes the problems of current spreading in structured light-emitting diodes and allows the improved decoupling of light to exert its full effects.

The vertical structuring of the top surface of the current-spreading layer can take any conceivable form. Feasible structures are, for example, n-sided prisms, pyramids or frusta of pyramids, cylinders, cones, frusta of cones and the like.

In particular, the second electrical contact layer can comprise a central, in particular circular contact surface and, arranged about said central contact surface, a contact structure that is rotationally symmetrical with respect to the center point of the central contact surface and is composed of relatively narrow contact webs and/or contact points. The rotational symmetry of the contact structure can be a symmetry represented by a whole number and can, in particular, match the rotational symmetry of the light-emitting diode. The usual case is a rectangular or square light-emitting diode, with the contact structure exhibiting fourfold symmetry.

The second electrical contact layer can be realized as either continuous or discontinuous; in the latter case, the discontinuous portions are interconnected by a layer of transparent, conductive material, for example indium-tin oxide (ITO).

The second electrical contact layer can be arranged on both structured and unstructured portions of the surface of the current-spreading layer.

DESCRIPTION OF DRAWINGS

The invention is described in more detail hereinbelow with reference to exemplary embodiments associated with the drawings, wherein.

DETAILED DESCRIPTION

Figure 1:
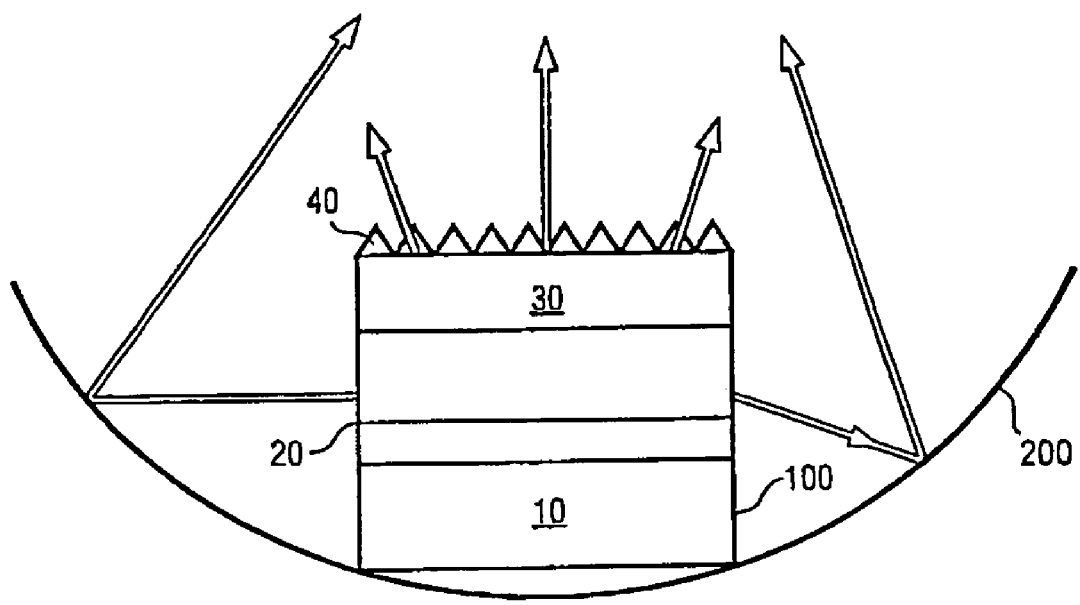
FIG. 1 is a schematic, simplified cross-sectional representation of a light-emitting diode with its surface structured according to the invention, arranged in a reflector.

FIG. 1 shows an LED chip 100, as arranged in a reflector 200 of circular or parabolic cross section, so that the light rays emitted by the chip both are radiated on a direct path and are collected by the reflector 200 and emitted in substantially the same direction. The LED chip 100 is generally embedded in a resin casting material, so that an interface between the semiconductor material and the resin casting material exists in particular on the surface of the chip through which the light exits. A relatively large jump in refractive index is present at this interface, so that total reflection occurs even at relatively low angles of incidence to the normal. Insofar as possible, these totally reflected rays are to be decoupled through the side walls of the LED chip 100 and collected by the reflector 200, instead of being absorbed in the substrate of the LED chip 100.

A light-emitting diode according to the invention has a semiconductor layer structure comprising a light-absorbing or transparent substrate 10 and at least one light-generating layer 20 formed on the substrate 10. The light-generating layer 20 is formed by a pn junction. If desired, a single or multiple quantum trough structure can be provided as the light-generating layer 20. Grown epitaxially on top of the light-generating layer 20 is a relatively thick, transparent semiconductor layer, the so-called current-spreading layer 30. A first electrical contact layer is deposited on the back of the substrate, covering its entire area, while a second electrical contact layer 50 is deposited on a portion of the current-spreading layer 30. The top surface of current-spreading layer 30 has structuring 40 designed to improve the decoupling of light. In the cross-sectional view of FIG. 1, this structuring 40 is depicted as a plurality of pyramids. These pyramids can have $n \geq 3$ sides, a cone being formed by the pyramids in the limiting case $n = \infty$. The apex can also be cut from the resulting structure, resulting in a frustum of a pyramid or cone. On the surface of the current-spreading layer 30 provided with the structuring 40, a second electrical contact layer 50 is deposited in such a way as to achieve the most uniform possible current coupling. To this end, the second electrical contact layer 50 is deposited with a grid-shaped structure. Exemplary embodiments of the shape of the second electrical contact layer are illustrated in FIGS. 2 to 4.

Figure 2:
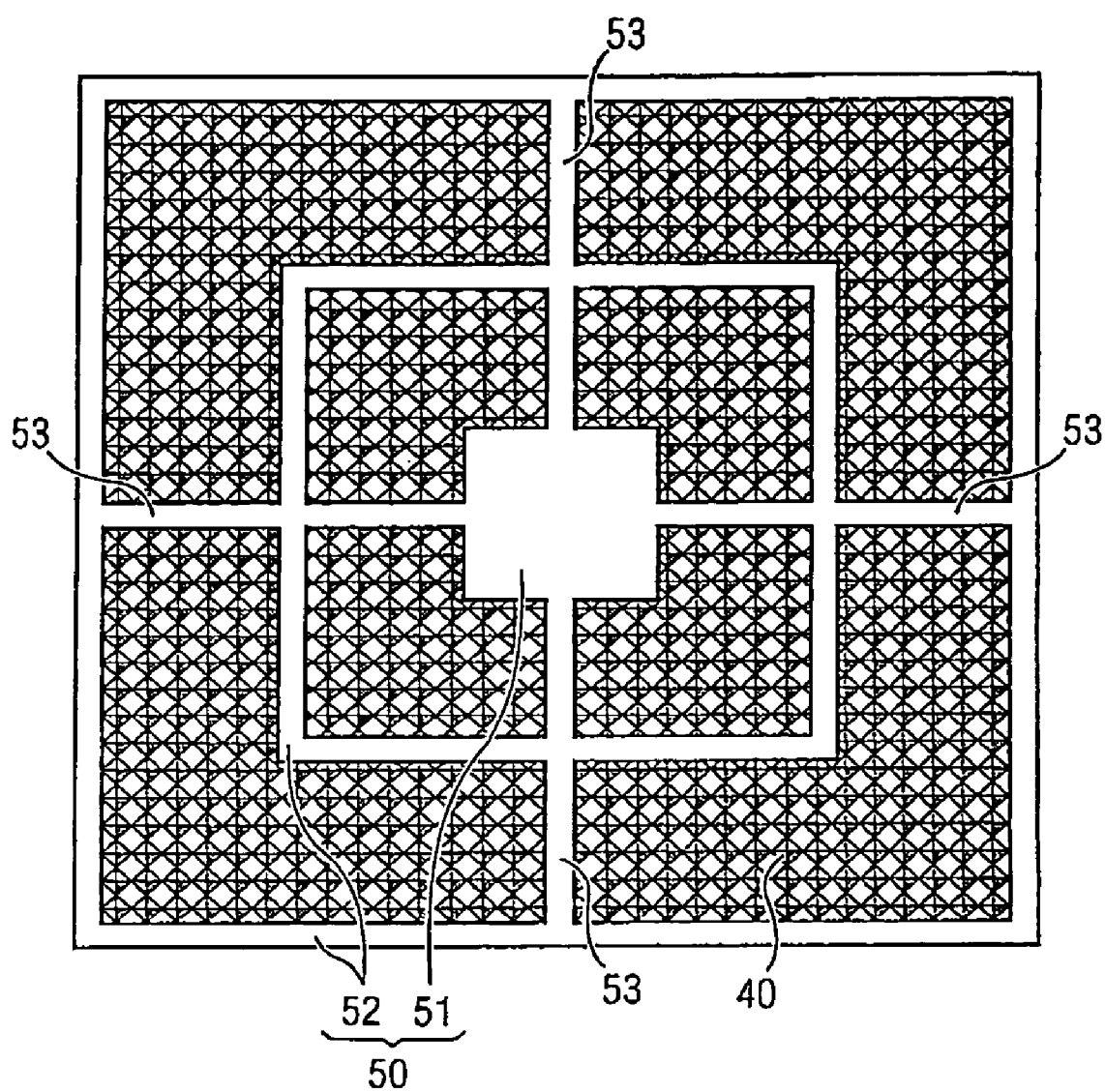
FIG. 2 is a first exemplary embodiment of the second electrical contact layer in a plan view on the structured light exit surface of the light-emitting diode.
Figure 3:
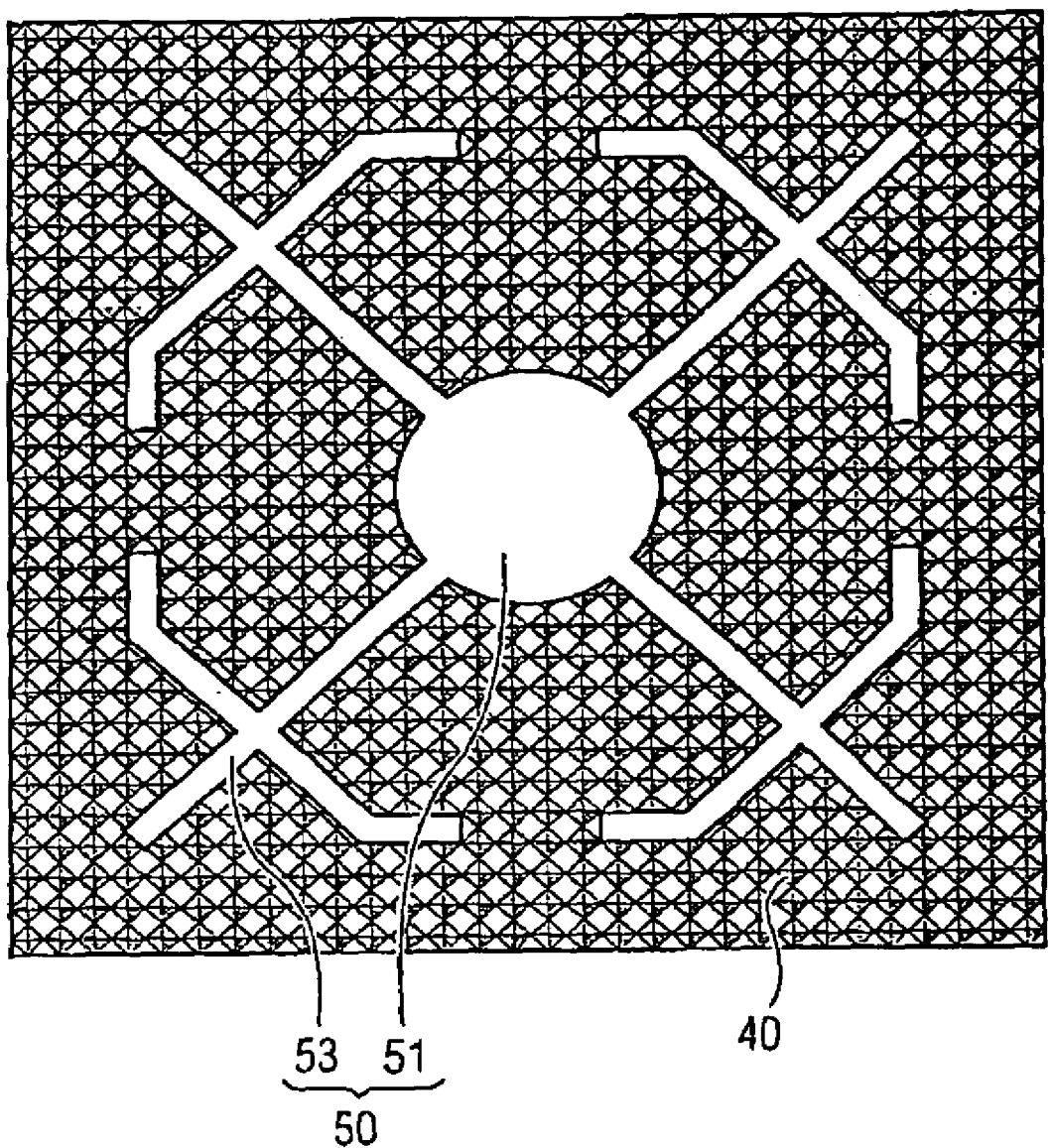
FIG. 3 is a second exemplary embodiment for a second electrical contact layer in a plan view on the structured light exit surface.
Figure 4:
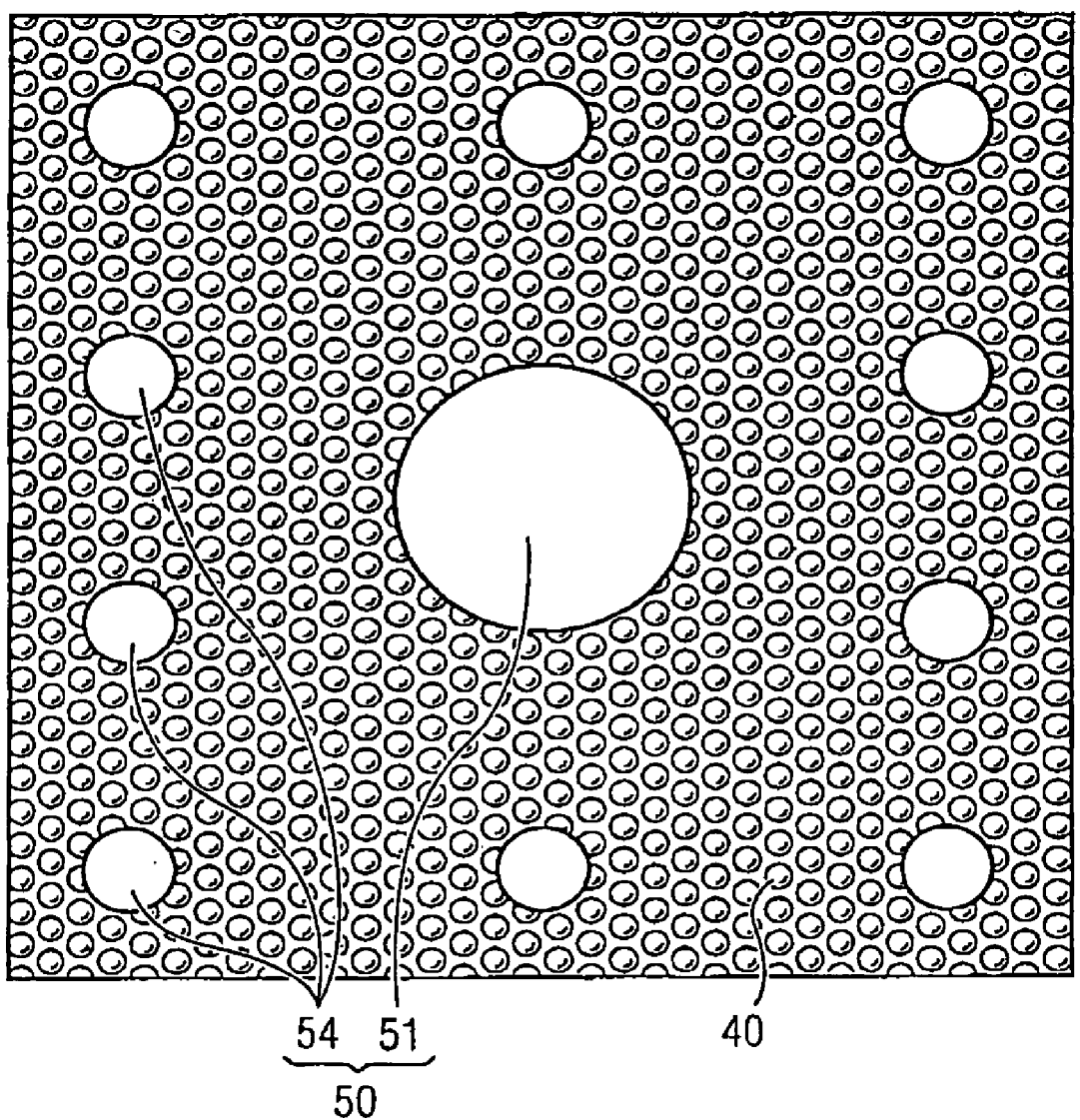
FIG. 4 is a third exemplary embodiment of a second electrical contact layer.

Shown in each of FIGS. 2 to 4 is a square-shaped light-emitting diode in a plan view on its light exit side, i.e., on the surface of the current-spreading layer 30 provided with the second electrical contact layer 50. In the exemplary embodiment of FIG. 2, the structuring 40 comprises a plurality of four-sided pyramids or frusta of pyramids arranged in a matrix shape. The second electrical contact layer 50 can generally be deposited on the unstructured areas of the surface of the current-spreading layer 30, i.e., at the bases of the pyramids. Alternatively, however, it can be deposited directly on the structuring 40. The second electrical contact layer 50 is preferably composed of a bonding alloy, such as Au:Zn or Au:Ge or the like. The exemplary embodiments of FIGS. 2 to 4 show feasible shapes for the structure of the second electrical contact layer 50, which are composed of a central, in particular circular or square contact surface 51, and, arranged about said central contact surface 51, a grid structure that is rotationally symmetrical with respect to the center point of central contact surface 51 and is composed of relatively narrow contact webs 52, 53 and/or contact points 54. To obtain the most uniform possible coupling of electrical current, the grid structure of the second electrical contact layer 50 has exactly the same rotational symmetry as the light-emitting diode itself. Consequently, if the light-emitting diode is square-shaped as in the exemplary embodiments, thus having fourfold symmetry, then the grid structure of the second electrical contact layer 50 is also configured with fourfold rotational symmetry about the center point of central contact surface 51.

The design of the contact layer 50 depicted in FIG. 2 has proven especially advantageous. In this exemplary embodiment, contact layer 50 has an outer and an inner circumferential contact web 52. The outer circumferential contact web 52 extends along the edge of substrate 10. The inner circumferential contact web 52 is arranged between the central contact surface 51 and the outer circumferential contact web 52. The outer circumferential contact web 52 and the inner circumferential contact web 52 are connected to each other and to central contact surface 51 via radially extending contact webs 53. Such a structure has proven especially advantageous for uniform current distribution in LED chips 100 of square cross section, because this design for the electrical contact layer 50 combines geometrical simplicity with uniform current distribution.

It is particularly advantageous in this case if the inner circumferential contact web 52 is disposed centrally between the outer circumferential contact web 52 and central contact surface 51, and if the radial contact webs 53 extend along the medians of the edges of light-generating layer 20.

The grid structure of second electrical contact layer 50 can be realized as a continuous structure, as in the exemplary embodiments of FIGS. 2 and 3. However, it can also be provided that the structure not be continuous. Such an exemplary embodiment is depicted in FIG. 4. Here, the grid structure comprises a circular central contact surface 51, surrounded in fourfold symmetry by circular contact points 54 that are not directly connected to central contact surface 51. To establish electrical contact between the unconnected portions of second electrical contact layer 50 in such exemplary embodiments as well, once contact surfaces 51 and 54 have been alloyed in, an additional thin, transparent, electrically conductive layer, for example of indium-tin oxide (ITO), is deposited on the structure. However, the grid structure of the second electrical contact layer 50 can also assume another form, for example a meander structure or the like.

The light-emitting diode according to the invention can be fabricated in various ways. Since the second electrical contact layer 50 theoretically can be deposited on the structuring 40, the simplest fabrication method is first to structure the top surface of the current-spreading layer 30 using the feasibilities described, and then to vapor-deposit the second electrical contact layer 50 through a shadow mask having an aperture area in the shape of the desired structure, or to use a sputter process for this purpose. Alternatively, the second electrical contact layer 50 can also first be deposited to cover the entire area by the aforesaid processes and then structured via a lithography and etching step or by the lift-off technique. In a second fabrication variant, the second electrical contact layer 50, with the desired lateral structure, is deposited on the still-unstructured surface of the current-spreading layer 30 via one of the aforesaid manufacturing processes and the vertical structuring of the top surface of current-spreading layer 30 is then performed, care being taken to avoid damaging the second electrical contact layer 50.

What is claimed is:

1. A light-emitting diode, comprising
   a semiconductor layer structure including a substrate and at least one light-generating layer formed on said substrate and one transparent current-spreading layer deposited on said light-generating layer, the top surface of said current-spreading layer has vertical structuring to improve the decoupling of light,
   a first electrical contact layer on the back of said substrate, and
   a second electrical contact layer comprising a lateral structure by means of which substantially uniform coupling of electrical current into said current-spreading layer can be achieved, said second electrical contact layer is discontinuous and is interconnected by a layer of transparent, conductive material said lateral structure comprising a central contact surface that is directly deposited on said current-spreading layer.

2. The light-emitting diode as described in claim 1, characterized in that
   said second electrical contact layer is a central contact surface and, arranged about said central contact surface, a contact structure that is rotationally symmetrical with respect to the center point of said central contact surface and is composed of relatively narrow contact webs and/or contact points.

3. The light-emitting diode as described in claim 2, characterized in that
   the rotational symmetry is a symmetry represented by a whole number.

4. The light emitting diode of claim 3 wherein said rotational symmetry matches the rotational symmetry of the light-emitting diode.

5. The light emitting diode of claim 2 wherein said central contact surface is a circular contact surface.

6. The light emitting diode of claim 2 wherein said central contact surface is a square contact surface.

7. The light-emitting diode as described in claim 1, characterized in that said second electrical contact layer is arranged on structured and/or unstructured portions of said current-spreading layer.

8. The light-emitting diode as described in claim 1, characterized in that
   the vertical structuring is in the form of n-sided (n>3) pyramids or frusta of pyramids cones or frusta of cones.

9. The light emitting diode of claim 8 wherein said n-sided (n>3) pyramids or frusta of pyramids, cones or frusta of cones are regularly arranged.

10. A method for fabricating a light-emitting diode as described in claim 1, characterized in that
    a light-generating layer and thereafter a relatively thick and transparent current-spreading layer are deposited on a substrate and the back of said substrate is provided with a first electrical contact layer,
    vertical structuring to improve the decoupling of light is produced in the surface of said current-spreading layer,
    a second electrical contact layer having the desired lateral structure is deposited on the structured top surface of said current-spreading layer.

11. The method for fabricating a light-emitting diode as described in claim 1, characterized in that
    a light-generating layer and thereafter a relatively thick and transparent current-spreading layer are deposited on a substrate and the back of said substrate is provided with a first electrical contact layer,
    a second electrical contact layer having the desired lateral structure is deposited on the top surface of said current-spreading layer, and
    vertical structuring to improve the decoupling of light is produced in the top surface of said current-spreading layer outside the areas of said second electrical contact layer.

12. The light-emitting diode as described in claim 1, wherein said lateral structure comprises a central contact structure and a circumferential contact web arranged about the central contact structure.

13. The light-emitting diode of claim 12, wherein the central contact structure and the circumferential contact web are directly deposited on the current-spreading layer.

14. The light-emitting diode as described in claim 1, characterized in that
    the vertical structuring is in the form of cones or frusta of cones.

15. The light emitting diode of claim 14 wherein said cones or frusta of cones are regularly arranged.

16. The light emitting diode of claim 1 wherein said lateral structure of said contact layer extends over and directly contacts said vertical structuring of said current-spreading layer.

17. The light-emitting diode of claim 1, wherein the lateral structure is directly deposited on the current-spreading layer.

18. The light-emitting diode as described in claim 1, wherein said substantially uniform coupling includes coupling of electrical current through the middle of the current spreading layer.

19. The light-emitting diode of claim 1, wherein the transparent, conductive material comprises indium tin oxide.

20. A light-emitting diode, comprising
a semiconductor layer structure including a substrate and at least one light-generating layer formed on said substrate and one transparent current-spreading layer deposited on said light-generating layer, the top surface of said current-spreading layer has vertical structuring to improve the decoupling of light,
a first electrical contact layer on the back of said substrate,
a second electrical contact layer comprising a lateral structure by means of which substantially uniform coupling of electrical current into said current-spreading layer can be achieved, wherein the second electrical contact layer comprises discontinuous portions, and
a layer of transparent, conductive material deposited on the second electrical contact layer to interconnect the discontinuous portions of the second electrical contact layer.

21. The light-emitting diode of claim 20, wherein the transparent, conductive material comprises indium tin oxide.

22. The light-emitting diode of claim 20, wherein the lateral structure is directly deposited on the current spreading layer.

* * * * *